(12) United States Patent
Chen et al.

(10) Patent No.: US 11,585,849 B2
(45) Date of Patent: Feb. 21, 2023

(54) APPARATUSES INVOLVING CALIBRATION OF INPUT OFFSET VOLTAGE AND SIGNAL DELAY OF CIRCUITS AND METHODS THEREOF

(71) Applicant: NXP USA, INC., Austin, TX (US)

(72) Inventors: Tao Chen, Austin, TX (US); Xiankun Jin, Austin, TX (US); Jan-Peter Schat, Hamburg (DE)

(73) Assignee: NXP USA, Inc., Austin, TX (US)

( * ) Notice: Subject to any disclaimer, the term of this patent is extended or adjusted under 35 U.S.C. 154(b) by 759 days.

(21) Appl. No.: 16/460,251

(22) Filed: Jul. 2, 2019

(65) Prior Publication Data

US 2021/0003633 A1    Jan. 7, 2021

(51) Int. Cl.

| G01R 31/3167 | (2006.01) |
| G01R 35/00 | (2006.01) |
| G01R 31/3177 | (2006.01) |
| G01R 31/317 | (2006.01) |
| H03M 1/66 | (2006.01) |
| H03M 7/16 | (2006.01) |
| H03M 1/10 | (2006.01) |

(52) U.S. Cl.
CPC ....... *G01R 31/3167* (2013.01); *G01R 35/005* (2013.01); *H03M 1/1071* (2013.01); *H03M 1/66* (2013.01); *H03M 7/16* (2013.01); *G01R 31/3177* (2013.01); *G01R 31/31723* (2013.01)

(58) Field of Classification Search
CPC .............. G01R 31/3167; G01R 35/005; G01R 31/31723; G01R 31/3177; H03M 1/1071; H03M 1/66; H03M 7/16

USPC ......................................................... 324/524
See application file for complete search history.

(56) References Cited

U.S. PATENT DOCUMENTS

| 5,487,172 A * | 1/1996 | Hyatt ...................... G06F 13/16 700/8 |
| 7,088,279 B2 * | 8/2006 | Muramatsu ........... H03M 1/123 341/155 |
| 9,157,939 B2 * | 10/2015 | Kain ................ G01R 19/16542 |
| 10,146,464 B2 * | 12/2018 | Murray ................ G06F 3/0673 |
| 10,866,277 B2 | 12/2020 | Schat et al. |

(Continued)

OTHER PUBLICATIONS

Condreva, Kenneth J. Discriminator/time interval meter system evaluation report. No. UCID-17069. California Univ., Livermore (USA). Lawrence Livermore Lab., 1976. (Year: 1976).*

(Continued)

*Primary Examiner* — Christopher P Mcandrew (57) ABSTRACT

An example apparatus includes a circuit and calibration circuitry. The circuit has complementary input ports to receive input signals including a monotonously rising and/or falling wave reference signal and a voltage-test signal to test at least one direct current (DC) voltage associated with the circuit by comparing the input signals using a first polarity and second polarity associated with the circuit to produce a first output signal and a second output signal. During operation, the circuit manifests an input voltage offset and a signal delay with each comparison of the input signals. The calibration circuitry processes the first and second output signals and, in response, calibrates or sets an adjustment for at least one signal path associated with the circuit in order to account for the input offset voltage and signal delay during normal operation of the circuit.

20 Claims, 7 Drawing Sheets

(56) References Cited

U.S. PATENT DOCUMENTS

| | | | |
|---|---|---|---|
| 2013/0015329 A1* | 1/2013 | Iwaki | H04N 5/378 341/158 |
| 2018/0309430 A1* | 10/2018 | Lin | H03M 1/1009 |
| 2018/0374520 A1* | 12/2018 | Ardestani | H03M 1/66 |

OTHER PUBLICATIONS

Circuit Techniques for Reducing the Effects of Op-Amp Imperfections: Autozeroing, Correlated Double Sampling, and Chopper Stabilization, Christian C. Enz, Gabor C. Temes, Proceedings of the IEEE vol. 84, No. 11, Nov. 1996.

An Average low Offset Comparator for 1.25 Gsamples/s ADC in 0.18μm CMOS, N. Stefanou, Sameer R. Sonkusale, Proceedings of the 2004 11th IEEE International Conference on Electronics, Circuits and Systems, ICECS 2004, p. 246-24.

R. Chinnarao, D. Asha, Pulse and Digital Circuits, Lecture Notes B. Tech (II Year-II Sem), (2017-2018).

Concurrent Sampling with Local Digitization—An Alternative to Analog Test Bus, Nanqi Liu, Shravan K. Chaganti, Zhiqiang Liu and Degang Chen, Amitava Majumdar, 2018 IEEE International Symposium on Circuits and Systems (ISCAS), p. 1-5.

EEE 1149.4 Standard for a mixed-Signal Test Bus (2010), IEEE Computer Society, pp. 1-116.

Liu et al., "Concurrent Sampling with Local Digitization—An Alternative to Analog Test Bus". IEEE 2018 ISCAS, Italy, May 2018, pp. 1-5.

Muramatsu et al., "A Signal-Processing CMOS Image Sensor Using a Simple Analog Operation," IEEE Journal of Solid-Slate Circuits, vol. 38, No. 1, Jan. 2003, pp. 101-106.

Nitta et al.: "High-Speed Digital Double Sampling with Analog CDS on Column Parallel ADC Architecture for Low-Noise Active Pixel Sensor", ISSCC 2006, Session 27, Image Sensors, 27.5, 2006 IEEE International Solid-State Circuits Conference, Feb. 8, 2006, pp. 1-8.

Sumanen et al., "A Mismatch Insensitive CMOS Dynamic Comparator for Pipeline AID Converters", The 7th IEEE International Conference on Electronics, Circuits and Systems, 2000. ICECS 2000, pp. 32-35.

* cited by examiner

FIG. 7

APPARATUSES INVOLVING CALIBRATION OF INPUT OFFSET VOLTAGE AND SIGNAL DELAY OF CIRCUITS AND METHODS THEREOF

OVERVIEW

Aspects of various embodiments are directed to apparatuses and methods thereof of calibrating circuits that test circuit nodes for input offset voltage and signal delay of the circuits.

For accessing analog test points, analog-test-busses (ATBs) are often used. The ATBs may include an analog-to-digital converter (ADC) that connects to one of a plurality of circuit nodes at a time, and sends output data to a compliant register for shift-out to an industry standard controller, such as a Joint Test Action Group (JTAG)-compliant controller. In such configurations, one circuit node is measured at a time. Additionally, as supply voltage and ground nodes may be connected to the ATB, there is a risk of accidental shorting.

These and other matters have presented challenges to efficiencies of circuit implementations, for a variety of applications.

SUMMARY

Various example embodiments are directed to issues such as those addressed above and/or others which may become apparent from the following disclosure concerning calibrating circuits that test circuit nodes for input offset voltage and signal delay of the circuits.

In certain example embodiments, aspects of the present disclosure involve generating an adjustment used to cancel the input offset voltage and signal delay of the circuits, and optionally, crosstalk voltage of the clock signal during normal operation of the circuit.

In a more specific example embodiment, an apparatus includes a circuit (e.g., a signal-comparison circuit) and calibration circuitry. The circuit has complementary input ports to receive input signals including a monotonously rising and/or falling wave reference signal and a voltage-test signal to test at least one direct current (DC) voltage associated with the circuit by comparing the input signals using a first polarity and a second polarity associated with the circuit. The first polarity associated with the circuit is used to produce a first output signal, and the second polarity associated with the circuit is used to produce a second output signal. During operation, the circuit manifests an input voltage offset and a signal delay with each comparison of the input signals. The calibration circuitry processes the first and second output signals and, in response, calibrates or sets an adjustment for at least one signal path associated with the circuit in order to account for the input offset voltage and signal delay during normal operation of the circuit. In various specific embodiments, the complementary input ports are differential input ports, and the monotonously rising and/or falling wave reference signal is characterized by a sinusoid or a curve that describes a continuous oscillation. In further related and specific embodiments, the circuit and calibration circuitry, responsive to the first and second output signals, calibrates or sets the adjustment for at least one signal path associated with the circuit in order to account for the input offset voltage, the signal delay, and crosstalk voltage of the clock signal during normal operation of the circuit.

The circuit includes, for example, a local circuit that compares the input signals and matrix circuitry. The matrix circuitry couples the voltage-test signal to a first of the complementary input ports for the first polarity of the circuit and couples the voltage-test signal to a second of the complementary input ports for the second polarity of the circuit, and the voltage-test signal being a constant value for the first and second output signals. The matrix circuitry, in specific embodiments, has a plurality of switch circuits to selectively provide the monotonously rising and/or falling wave reference signal and the voltage-test signal to the complementary input ports of the circuit to provide each of the first and second output signals.

In specific embodiments, the matrix circuit selectively provides the monotonously rising and/or falling wave reference signal to a first of the complementary input ports and the voltage-test signal to a second of the complementary input ports for one of the first and second output signals, and selectively provides the monotonously rising and/or falling wave reference signal to the second of complementary input ports and the voltage-test signal to the first of complementary input ports for the other of the first and second output signals. For example, the matrix circuitry selectively couples the complementary input ports of the circuit to the monotonously rising and/or falling wave reference signal and the voltage-test signal in response to the monotonously rising and/or falling wave reference signal being equal to or greater than the voltage-test signal plus the input offset voltage. In other examples, the matrix circuitry selectively couples the complementary input ports of the circuit to the monotonously rising and/or falling wave reference signal and the voltage-test signal in response to monotonously rising and/or falling wave reference signal being equal to or less than the voltage-test signal minus the input offset voltage.

The apparatus may further include a digital-to-analog converter (DAC) to generate the monotonously rising and/or falling wave reference signal and/or a circuit node that generates the voltage-test signal. The DAC is arranged with a circuit to selectively drive a different one of the complementary input ports of the circuit to produce the first and second output signals. In some embodiments, the apparatus is an analog-test bus (ATB) apparatus having a plurality of local test point circuits, each having a respective circuit node to be tested. The apparatus may further include a digital bus to distribute DAC input codes to the plurality of local test point circuits of the apparatus. A test point circuit includes the circuit (e.g., local circuit to compare input signals and matrix circuitry) and a memory circuit (e.g., register) to store codes corresponding to the first and second output signals of the circuit. The apparatus includes the plurality of test point circuits, including the test point circuit, each of the plurality including a respective circuit and a memory circuit (e.g., a register).

In various specific embodiments, the apparatus includes sine-wave generator circuitry to provide a control signal to the circuit in response to the sine wave reference signal completing a cycle. The apparatus may additionally include a binary-to-Gray code circuit configured to convert DAC input codes to Gray codes.

The matrix circuitry may be used to couple both of the differential input ports of the circuit to the monotonously rising and/or falling wave reference signal. In such embodiments, the monotonously rising and/or falling wave reference signal is used to create a Physically Unclonable Function (PUF) due to a sensed input offset voltage being negative or positive with an approximately fifty percent likelihood.

In another specific example embodiment, an apparatus includes the above-described DAC, circuit with complementary input ports (e.g., the signal-comparison circuit), and calibration circuitry. The circuit has and/or is otherwise associated with the first polarity and second polarity. The first polarity associated with the circuit produces a first output signal in response to one of the complementary input ports coupled to the voltage-test signal, and the second polarity associated with the circuit produces a second output signal in response to the other of the complementary input ports coupled to the voltage-test signal. As previously described, the DAC is configured and arranged with the circuit to selectively drive the other of the complementary input ports of the circuit for the first polarity and the one of the complementary input ports for the second polarity. The apparatus may further include a circuit node configured and arranged with the circuit to selectively drive the one of the complementary input ports of the circuit with the voltage-test signal for the first polarity and the other of the complementary input ports of the circuit with the voltage-test signal for the second polarity.

In some specific embodiments, the DAC has a resolution in a range of not less than four and not more than ten bits. In such embodiments, the apparatus may further include a low pass filter configured and arranged with the DAC to generate the monotonously rising and/or falling wave reference signal, wherein the calibration circuitry is configured and arranged with the circuit to account for the input offset voltage and the signal delay attributable to the circuit, and a signal delay attributable to the low pass filter, using the calibrated or set adjustment during normal operation of the circuit.

As previously described, the apparatus may include a plurality of test point circuits, each respectively including a circuit node to generate a respective voltage-test signal and a circuit to compare input signals. The calibration circuitry is configured and arranged with the plurality of test point circuits to process respective first and second output signals and, in response, calibrate or set a plurality of adjustments for a plurality of signal paths associated with the plurality of (local or signal-comparison) circuits in order to account for the input offset voltage and signal delay during normal operation of the plurality of circuits. In some related and more specific embodiments, each of the plurality of circuits include matrix circuitry configured to couple the complementary input ports of each of the plurality of circuits to the monotonously rising or falling wave reference signal and, in response, to produce a plurality of additional output signals, and the calibration circuitry is configured and arranged with the plurality of circuits to provide a PUF using the plurality of additional output signals The apparatus may further include a binary-to-Gray code circuit configured and arranged to convert DAC input codes to Gray codes. The calibration circuitry, in response to the first and second output signals, calibrates or sets the adjustment for the at least one signal path in order to account for the input offset voltage, the signal delay, and crosstalk voltage of the clock signal and the Gray codes during normal operation of the circuit.

The above discussion/summary is not intended to describe each embodiment or every implementation of the present disclosure. The figures and detailed description that follow also exemplify various embodiments.

BRIEF DESCRIPTION OF FIGURES

Various example embodiments may be more completely understood in consideration of the following detailed description in connection with the accompanying drawings, in which.

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods involving calibration of the circuits for use in testing circuit nodes including calibration of the input offset voltage and signal delay associated with the circuits during normal operation. In certain implementations, aspects of the present disclosure have been shown to be beneficial when used in the context of an analog-test-bus that includes at least one digital-to-analog converter (DAC) that provides a rising and/or falling wave reference signal (e.g., voltage) used to test each of the circuit nodes at one time by local circuits comparing the reference signal against the voltage of the respective circuit node. In some embodiments, the apparatus includes a signal-comparison circuit (e.g., amplifier(s) and/or comparator(s)) per circuit node, which may be imprecise and below a threshold in size, and with the error or impreciseness of the signal-comparison circuits being accounted for (e.g., calibrated away) using the apparatus. While not necessarily so limited, various aspects may be appreciated through the following discussion of non-limiting examples which use exemplary contexts.

Accordingly, in the following description various specific details are set forth to describe specific examples presented herein. It should be apparent to one skilled in the art, however, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element. Also, although aspects and features may in some cases be described in individual figures, it will be appreciated that features from one figure or embodiment may be combined with features of another figure or embodiment even though the combination is not explicitly shown or explicitly described as a combination.

Analog-test-busses (ATBs) are used to access analog test points, sometimes herein referred to as circuit nodes. In some implementations, an analog-to-digital converter (ADC) is selectively connected to each circuit node, where the ADC sends its output data to compliant registers for shift-out to a protocol compliant controller, such as a compliant register for shift-out to an industry standard test access port (TAP) controller, such as a Joint Test Action Group (JTAG)-compliant TAP controller. The use of the ADC includes one measurement (e.g., one node) at a time and has a risk of shorting. For example, in the instance of Vdd node and a ground node, there may be a risk of accidental shorting. This may be overcome by high-ohmic ATB switches, or a strict break-before-make behavior, including during start-up and supply voltage levels. In some embodiments, a DAC is used to provide a rising and/or falling wave reference signal ($V_{ref}$) and local circuits, sometimes referred to as "signal-comparison circuits" or "comparator circuits, compare the reference signal against the voltage of the circuit node under test. Each of the circuit nodes are tested in parallel, and the risk of shorting may be mitigated.

Embodiments in accordance with the present disclosure include apparatuses that use a DAC while mitigating a number of issues due to use of the DAC and/or signal-comparison circuits. Example mitigated issues include the connections from the circuit nodes and the DAC to the signal-comparison circuits may be susceptible to parasitic noise due to cross-talk from neighboring wires and/or due to electromagnetic waves from inside or outside the integrated circuit (IC). Additionally, the $V_{ref}$ line and connection from each circuit node to the signal-comparison circuits is susceptible to ground bounce (e.g., the difference of a DAC ground versus the signal-comparison circuit ground and/or difference of the node ground and the signal-comparison circuit ground). As another example, in order to provide parallel measurements, one signal-comparison circuit per circuit node is used. As there are often thousands of circuit nodes, there may be thousands of signal-comparison circuits used. In many implementations, either the signal-comparison circuits are precise, and take up significant IC area, or they are small and imprecise. As used herein, imprecise includes or refers to having a non-zero offset to the input voltage and having different gains at the signal and the reference input. The data transfer after each DAC step may disturb the power grid, and even if DAC supplies and grounds are separated, the ground bounce or cross-talk over the substrate may lead to disturbing analog supplies during the digital shift-out. While fast low-drop out regulators (LDOs) limit the disturbance to a few microseconds or less, the sensitive analog circuit nodes may take longer to recover from such a Vdd drop. Embodiments in accordance with the present disclosure include use of imprecise (and small) signal-comparison circuits in an ATB apparatus that involves measuring all of the circuit nodes in parallel and that accounts for inaccuracies attributable to the signal-comparison circuits using sets of adjustment values. For example, there is an adjustment (e.g., a value) determined for each of the signal-comparison circuits that accounts for the input offset voltage and signal delay, and, optionally, crosstalk voltage of the clock signal during normal operation of the circuit, and without the use of an additional on-chip DAC.

A number of embodiments are directed to an apparatus that calibrates a circuit, such as a signal-comparison circuit. The apparatus includes a circuit and calibration circuitry. The circuit has complementary input ports to receive input signals including a monotonously rising and/or falling wave reference signal and a voltage-test signal to test at least one direct current (DC) voltage associated with the circuit by comparing the input signals using a first polarity and a second polarity associated with the circuit. The first polarity associated with the circuit produces a first output signal, and the second polarity associated with the circuit produces a second output signal. As previously described, during operation, the circuit manifests an input voltage offset and a signal delay with each comparison of the input signals. The calibration circuitry processes the first and second output signals and, in response, calibrates or sets an adjustment for at least one signal path associated with the circuit in order to account for the input offset voltage and signal delay during normal operation of the circuit. The complementary input ports may be differential input ports, and the monotonously rising and/or falling wave reference signal is characterized by a sinusoid or a curve that describes a continuous oscillation. In specific embodiments, the circuit and calibration circuitry, responsive to the first and second output signals, calibrate or set the adjustment for at least one signal path associated with the circuit in order to account for the input offset voltage, the signal delay, and crosstalk voltage of the clock signal during normal operation of the circuit.

The circuit includes, for example, a local circuit (e.g., the signal-comparison circuit or comparator circuit) to compare the input signals and matrix circuitry. The matrix circuitry couples the voltage-test signal to a first of the complementary input ports for the first polarity of the circuit and couples the voltage-test signal to a second of the complementary input ports for the second polarity of the circuit, with the voltage-test signal being a constant value for the first and second output signals. The matrix circuitry, in specific embodiments, has a plurality of switch circuits to selectively provide the monotonously rising and/or falling wave reference signal and the voltage-test signal to the complementary input ports of the circuit to provide each of the first and second output signals. As a specific example, the matrix circuit selectively provides the monotonously rising and/or falling wave reference signal to a first of the complementary input ports and the voltage-test signal to a second of the complementary input ports for one of the first and second output signals and selectively provide the monotonously rising and/or falling wave reference signal to the second of complementary input ports and the voltage-test signal to the first of complementary input ports for the other of the first and second output signals.

The apparatus may further include a DAC to generate the monotonously rising and/or falling wave reference signal and/or a circuit node that generates the voltage-test signal. The DAC is arranged with circuit to selectively drive a different one of the complementary input ports of the circuit to produce the first and second output signals. In some embodiments, the apparatus is an ATB apparatus having a plurality of local test point circuits, each having a respective circuit node to be tested. The apparatus may further include a digital bus to distribute DAC input codes to the plurality of local test point circuits of the apparatus. A test point circuit, for example, includes the circuit and a memory circuit (e.g., register) to store codes corresponding to the first and second output signals of the circuit, and the apparatus includes a plurality of test point circuits, including the test point circuit, each of the plurality including a respective circuit and a memory circuit (e.g., a register).

In various specific embodiments, the apparatus includes continuous-wave or sine-wave generator circuitry to provide a (switching) control signal to the circuit in response to the sine wave reference signal completing a cycle. The apparatus may additionally include a binary-to-Gray code circuit configured to convert DAC input codes to Gray codes.

In some specific example embodiments, the DAC has a resolution in a range of not less than four (or six) and not more than ten (or eight) bits. In such embodiments, the apparatus may further include a low pass filter configured and arranged with the DAC to generate the monotonously rising and/or falling sine wave reference signal, wherein the calibration circuitry is configured and arranged with the circuit to account for the input offset voltage and the signal delay attributable to the circuit, and a signal delay attributable to the low pass filter, using the calibrated or set adjustment during normal operation of the circuit.

The matrix circuitry may couple both of the differential input ports of the circuit to the monotonously rising and/or falling wave reference signal (e.g., the sine wave), such as at start-up or other times, and the reference signal at is used to create a Physically Unclonable Function (PUF) due to a sensed offset voltage being negative or positive with an approximately fifty percent likelihood. As previously described, the apparatus may include a plurality of test point circuits, the plurality each respectively including a circuit to compare the input signals and a circuit node to generate a respective voltage-test signal. Each of the plurality of test point circuits include matrix circuitry that couples the complementary input ports of each of the plurality of circuits to the monotonously rising or falling wave reference signal and, in response, to produce a plurality of additional output signals, and the calibration circuitry is configured and arranged with the plurality of circuits to provide a PUF using the plurality of additional output signals.

Figure 1:
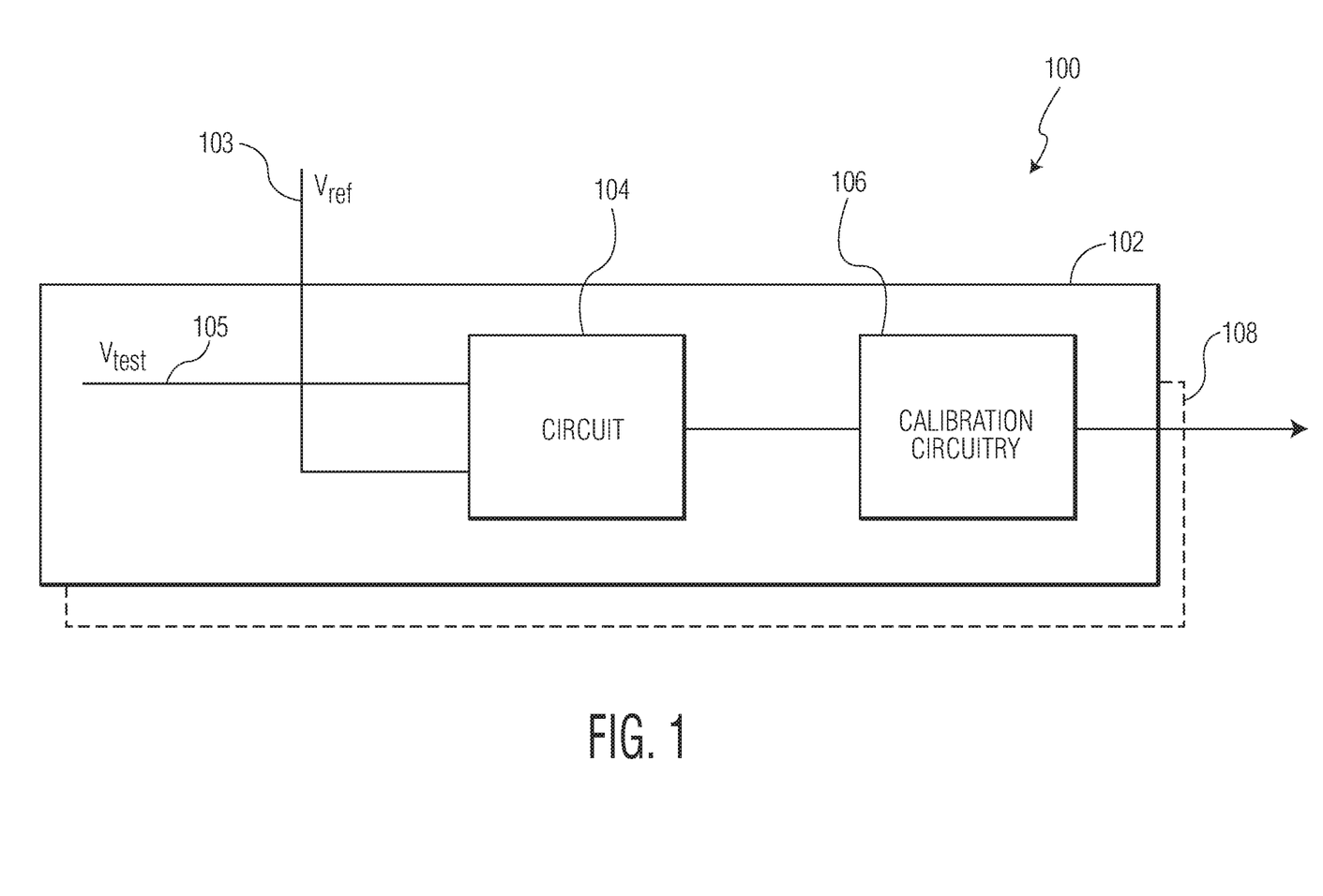
FIG. 1 illustrates an example apparatus, in accordance with the present disclosure.

Turning now to the figures, FIG. 1 illustrates an example apparatus, in accordance with the present disclosure. In specific embodiments, the apparatus 100 includes or forms part of an ATB apparatus having a plurality of local test point circuits 102, 108, with each of the local test point circuits 102, 108 having a respective circuit node for testing and a circuit 104 (e.g., comparator and/or amplifier circuit) to test the respective circuit node using input signals from the circuit node and a reference signal. The input signal from the circuit node may include a voltage-test signal ($V_{test}$) 105 and the reference signal is a rising and/or falling wave reference signal ($V_{ref}$) 103. As further shown herein, a DAC may provide $V_{ref}$ 103 that rises or falls (slowly), which is compared to the output voltages of the circuit nodes, and the apparatus 100 includes a digital bus to distribute DAC input codes to the plurality of local test point circuits 102, 108. More specifically, the rising and/or failing wave reference signal $V_{ref}$ 103 is characterized by a sinusoid or a curve that describes a continuous oscillation, such as a sine wave. The following describes details of the particular test point circuit 102. The other test point circuit 108 (or more) may additionally include instances of the circuit components as illustrated and described in reference to the test point circuit 102, although the details are not illustrated by FIG. 1.

The circuit 104 receives and compares the input signals including a monotonously rising and/or falling wave reference signal $V_{ref}$ 103 and a voltage-test signal $V_{test}$ 105 to test at least one DC voltage associated with the circuit 104. For ease of reference, the monotonously rising and/or falling wave reference signal is sometimes herein referred to as "$V_{ref}$" and the voltage-test signal as "$V_{test}$". As described above, the circuit 104, during normal operation, may manifest an input offset voltage and a signal delay. To calibrate the circuit 104, the circuit 104 tests the DC voltage by comparing the input signals using a first polarity associated with the circuit 104 to produce a first output signal, and a second polarity associated with the circuit 104 to produce a second output signal. In specific embodiments, the circuit 104 includes differential to single-ended amplifiers and/or differential comparators to compare the input signals (e.g., $V_{ref}$ 103 and $V_{test}$ 105) and a matrix circuit. The differential to single-ended amplifiers and/or differential comparators are sometimes referred to as "signal-comparison circuits" for ease of reference.

The circuit 104 has a first complementary input port and a second complementary input port, such as differential input ports. The first and second polarity associated with the circuit 104 is used to calibrate the circuit 104 to account for the input offset voltage and a signal delay. Each polarity is respectively associated with one of the input signals, such as $V_{test}$ 105, being coupled to a respective one of the complementary input ports, as further illustrated by FIG. 3. As a specific example, the first polarity of the circuit 104 is associated with a first of the complementary input ports coupled to the $V_{test}$ 105 and the second polarity of the circuit 104 is associated with a second of the complement input ports coupled to $V_{test}$ 105. In such embodiments, the circuit 104 further includes matrix circuitry to couple $V_{test}$ 105 to the first complementary input port for the first polarity of the circuit 104 and to couple $V_{test}$ 105 to the second complementary input port for the second polarity of the circuit 104. $V_{test}$ 105 may remain a constant value for producing each of the first and second output signals, such that the first and second output signals are used to calibrate or set the adjustment in order to account for the input offset voltage and signal delay during normal operation of the circuit 104. The matrix circuitry selectively drives a different one of the complementary input ports of the circuit 104 to produce the first and second output signals. Further example details of the circuit 104 including the matrix circuitry and complementary input ports is further illustrated and described by FIGS. 2 and 3.

The calibration circuitry 106 processes the first and second output signals from the circuit 104 and calibrates or sets an adjustment for at least one signal path associated with the circuit 104. The adjustment accounts for the input offset voltage and signal delay during normal operation of the circuit 104. The adjustment may include a (single) value that is used to calibrate the circuit 104 during normal operations to account (e.g., cancel) for the input offset voltage and the signal delay, among other calibrations. A single or constant value for the $V_{test}$ 105, with swapped inputs signals at the complementary input ports between the first and second output signals, may be used to generate the adjustment which is subsequently used to cancel the input offset voltage and signal delay during normal operation of the circuit 104.

In specific embodiments, the calibration circuitry 106 includes or forms part of data storage and logic circuitry. For example, the local test point circuit 102 includes a local memory circuit, such as a register, to store codes corresponding to the first and second output signals of the circuit 104 and which is used by the logic circuitry to calibrate the adjustment. The apparatus 100, as previously described, may include a plurality of local test point circuits 102, 108, with each including a respective circuit (e.g., matrix circuitry and signal-comparison circuit) and memory circuity (e.g., register). The output from the circuit 104 may be provided to compliant registers for shift-out to a protocol compliant controller, such as a compliant register for shift-out to a central industry standard controller, such as a JTAG-compliant TAP controller.

Figure 2:
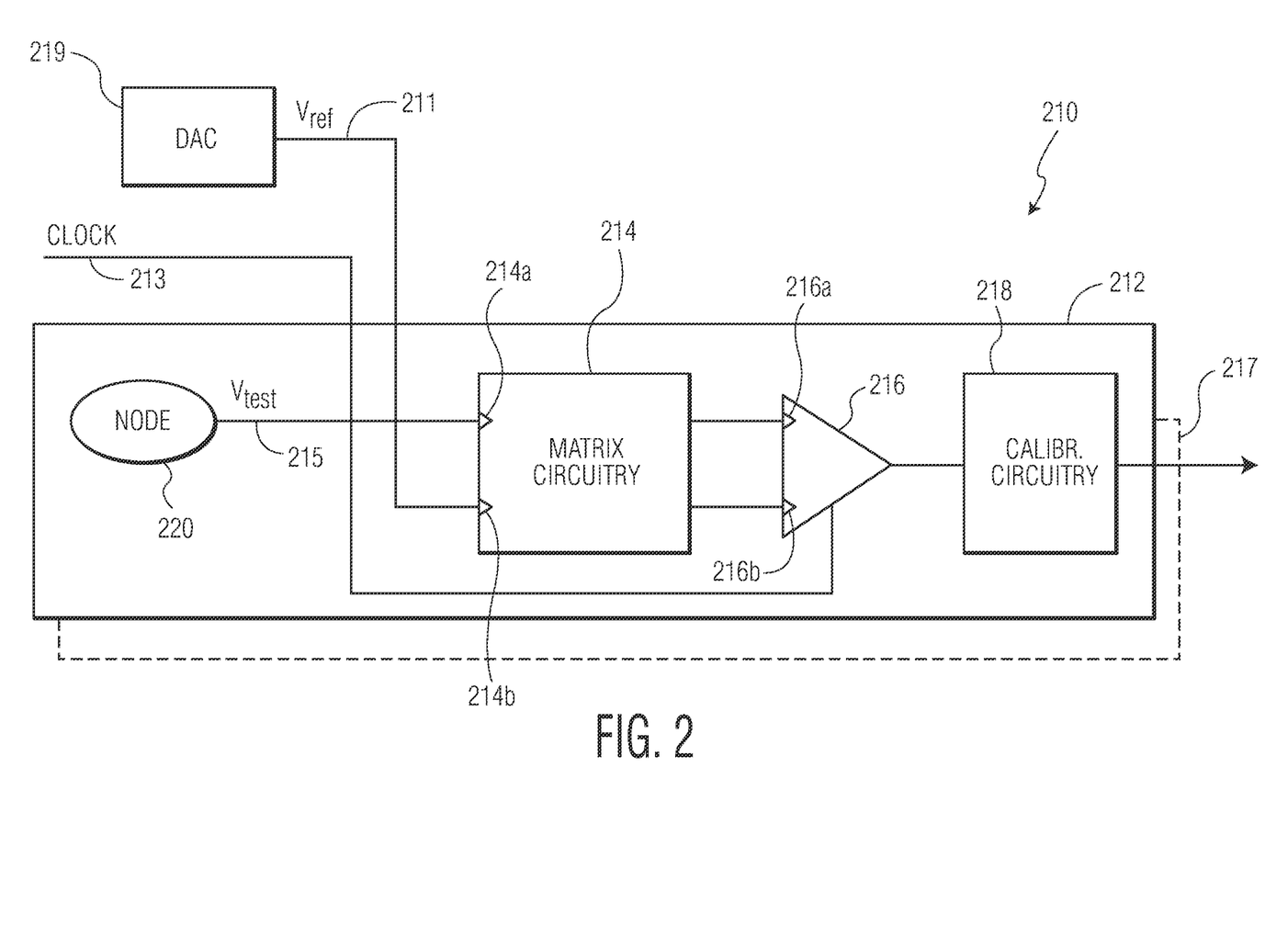
FIG. 2 illustrates an example apparatus including a digital-to-analog converter (DAC), in accordance with the present disclosure.

FIG. 2 illustrates an example apparatus including a digital-to-analog converter (DAC), in accordance with the present disclosure. As previously described, the DAC 219 generates a rising and/or falling wave reference signal $V_{ref}$ 211, which is distributed to a plurality of local test points 212, 217 via an analog bus. Similarly to FIG. 1, the apparatus 210 may include an ATB apparatus having a plurality of local test point circuits 212, 217, with each test point circuit having respective circuit nodes 220 that are tested by circuits 214, 216. The circuits 214, 216 test a DC voltage associated with the circuit nodes 220. For ease of reference, details of a single local test point circuit 212 is illustrated by FIG. 2. However, embodiments in accordance with the present disclosure include an apparatus 210 having a plurality of test point circuits and respective circuit nodes. For example, the other test point circuit 217 may additionally include instances of the circuit components as illustrated and described in reference to the test point circuit 212, although the details are not illustrated by FIG. 2. The circuit node 220 is tested by comparing input signals including $V_{test}$ 215 from the circuit node 220 and $V_{ref}$ 211 from the DAC 219.

As described above in connection with FIG. 1, the signal processing circuitry of FIG. 2 includes a signal-comparison circuit 216 having complementary input ports 216a and 216b and matrix circuitry 214 also including complementary input ports 214a and 214b. The signal-comparison circuit 216 is calibrated to account for the input offset voltage and the signal delay using the single adjustment for the respective signal-comparison circuit 216. In various more specific embodiments, the single adjustment is used to account for the input offset voltage, the signal delay, and crosstalk voltage of the clock signal 213 during normal operation of the circuit 214, 216 (e.g., signal-comparison circuit 216). The circuits 214, 216 receive input signals including a monotonously rising and/or falling wave reference signal (e.g., $V_{ref}$) and a voltage-test signal (e.g., $V_{test}$) as may be used to test at least one DC voltage associated with the circuit.

Similarly to testing the circuit node 220, the circuit 214, 216 is calibrated by comparing the input signals 211, 215 using a first polarity associated with the circuit 214, 216 to produce a first output signal in response to one of the complementary input ports coupled to the voltage-test signal $V_{test}$ 215, and a second polarity associated with the circuit 214, 216 to produce a second output signal in response to the other of the complementary input ports coupled to the voltage-test signal $V_{test}$ 215. The value of $V_{test}$ 215 remains constant or substantially constant for each of the first and second polarity, such that the first and second output signals are used by the calibration circuitry 218 to calibrate or set an adjustment, as previously described. The adjustment is used to account for the input offset voltage and signal delay during normal operation of the circuit (e.g., the signal-comparison circuit 216).

The matrix circuitry 214 selectively provides the monotonously rising and/or falling wave reference signal $V_{ref}$ 211 and the voltage-test signal $V_{test}$ 215 to the complementary input ports of the circuit 214, 216 to provide each of the first and second output signals. In a specific example, the circuit node 220 selectively drives one of the complementary input ports of the circuit 214, 216 with the voltage-test signal $V_{test}$ 215 for the first polarity and the other of the complementary input ports of the circuit 214, 216 with the voltage-test signal $V_{test}$ 215 for the second polarity and the DAC 219 selectively drives the other of the complementary input ports of the circuit 214, 216 for the first polarity and the one of the complementary input ports for the second polarity. More specifically, the matrix circuitry 214 selectively provides $V_{ref}$ 211 to a first of the complementary input ports and $V_{test}$ 215 to a second of the complementary input ports for one of the first and second output signals and selectively provides $V_{ref}$ 211 to the second of complementary input ports and the $V_{test}$ 215 to the first of complementary input ports for the other of the first and second output signals. In specific and related embodiments, the matrix circuitry 214 selectively couples the complementary input ports of the signal-comparison circuit 216 to the $V_{ref}$ 211 and the $V_{test}$ 215 signals in response to the $V_{ref}$ signal being equal to or greater than the $V_{test}$ signal plus the input offset voltage or being equal to or less than the $V_{test}$ signal minus the input offset voltage, although embodiments are not so limited.

Figure 3:
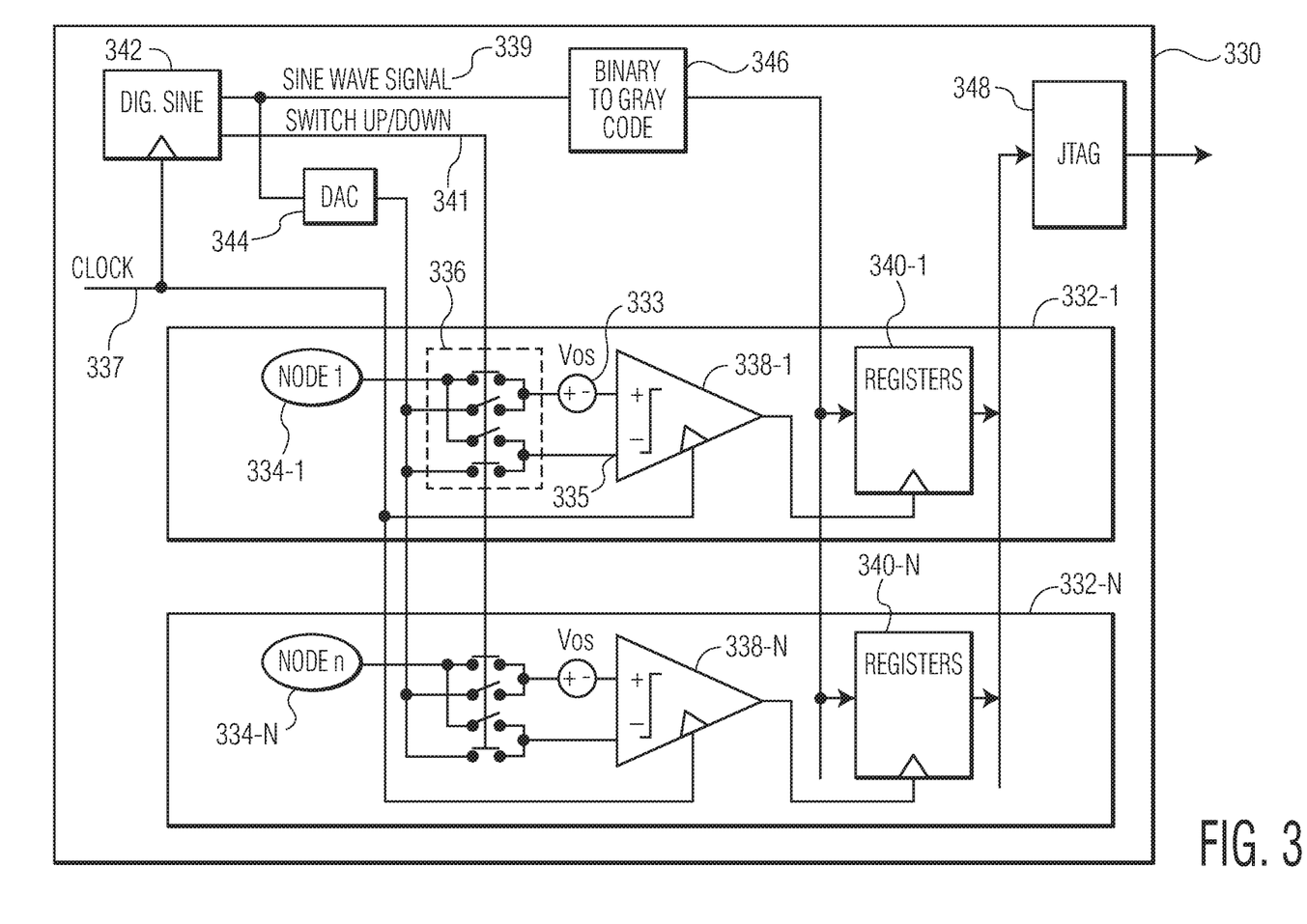
FIG. 3 illustrates an example apparatus for calibrating an input offset voltage and signal delay, in accordance with the present disclosure.
Figure 5:
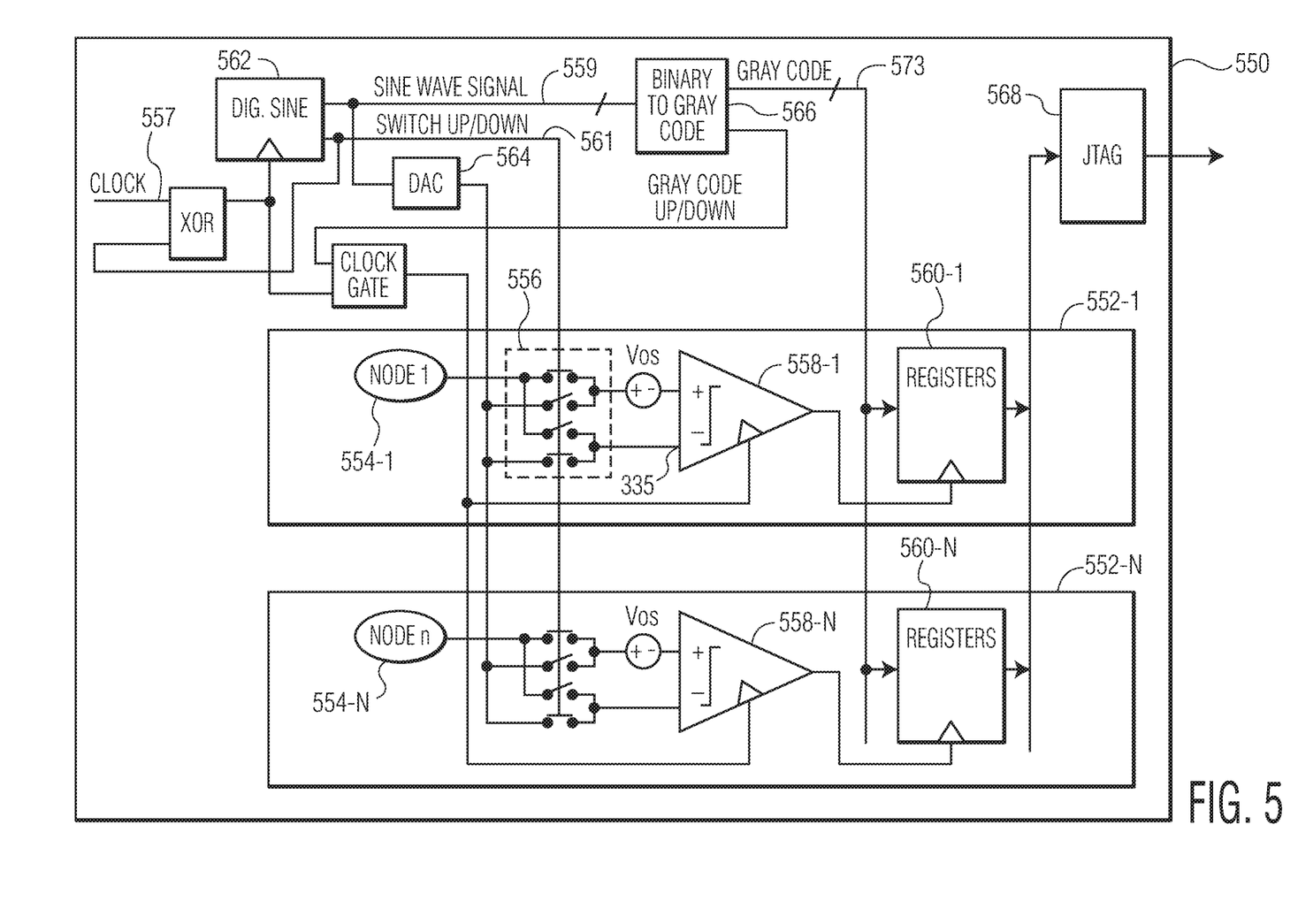
FIG. 5 illustrates an example apparatus for calibrating an input offset voltage and signal delay, in accordance with the present disclosure.

An example matrix circuitry includes a plurality of switch circuits, as further illustrated by FIGS. 3 and 5. However, embodiments are not so limited and the matrix circuitry 214 may be implemented in a variety of ways.

As described above, the apparatus 210 may include a plurality of circuits, such as a matrix circuits 214 and signal-comparison circuits 216 in a plurality of local test point circuits. Each of the test point circuits respectively including a circuit node to generate a respective voltage-test signal and calibration circuitry. The calibration circuitry is configured and arranged with the plurality of circuits to process respective first and second output signals and, in response, calibrate or set a plurality of adjustments for a plurality of signal paths associated with the plurality of circuits in order to account for the input offset voltage and signal delay during normal operation of the plurality of circuits. In some specific embodiments, as further described by FIG. 6, the plurality of circuits are used to provide a PUF. For example, each of the plurality of circuits include matrix circuitry to couple the complementary input ports of each of the plurality of circuits to the $V_{ref}$ 211 (e.g., from the DAC 219) and, in response, to produce a plurality of additional output signals, and the calibration circuitry provides the PUF using the plurality of additional output signals. More specifically, the reference signal $V_{ref}$ 211 is used to create a PUF due to a sensed input offset voltage being negative or positive with an approximately fifty percent likelihood (e.g., couple $V_{ref}$ 211 to create PUF because the input offset voltage is either negative or positive with an approximately 50% likelihood and thus the output of the signal-comparison circuit 216 is 0 or 1).

FIG. 3 illustrates an example apparatus for calibrating an input offset voltage and signal delay, in accordance with the present disclosure. The apparatus 330 may include an ATB apparatus having a plurality of local test point circuits 332-1, 332-N. Each of the local test point circuits 332-1, 332-N have circuit nodes 334-1, 334-N which are tested by signal-comparison circuits 338-1, 338-N using input signals from the circuit nodes 334-1, 334-N and a central DAC 344. An analog bus distributes the $V_{ref}$ from the DAC 344 to signal-comparison circuits 338-1, 338-N of each of the plurality of local test point circuits 332-1, 332-N. As further described herein, the apparatus 330 further includes calibration circuitry, which may include portions that are local to the test point circuits (e.g., registers 340-1, 340-N) and central to the apparatus 330 (e.g., JTAG controller 348) used to calibrate the signal-comparison circuits 338-1, 338-N.

As previously described and in many embodiments, the signal-comparison circuits 338-1, 338-N have low precision to allow for lower power consumption, low bandwidth, and low spatial area. For example, as $V_{ref}$ is a sine wave with moderate frequency, the signal-comparison circuit bandwidth may be limited to a frequency slightly above the frequency of the $V_{ref}$ signal. To achieve high overall measurement accuracy, the signal-comparison circuits 338-1, 338-N are calibrated using an adjustment generated from two output signals using the same $V_{test}$ value from the circuit node 334-1, 334-N. The adjustment accounts for, such as by canceling, the signal delay (e.g., propagation delay of the signal-comparison circuit) and the input offset voltage. As both are accounted for using the calibration circuitry, the signal-comparison circuits 338-1, 338-N, in various embodiments, exhibit relatively large propagation delay, providing it is below the period length of $V_{ref}$ and a relatively large input offset voltage. In accordance with various embodiments, the DAC 344 provides a $V_{ref}$ that is a sine wave. Use of a sine wave allows for distribution of $V_{ref}$ with lower requirements to the supply power, bandwidth and area as compared to a ramp signal.

Each of the signal-comparison circuits 338-1, 338-N are calibrated by measurement runs in which the input signals to the signal-comparison circuits 338-1, 338-N are selectively switched between $V_{ref}$ and the respective $V_{test}$ of the corresponding circuit node 334-1, 334-N. The following describes calibration of the particular signal-comparison circuit 338-1 of test point circuit 332-1, but as may be appreciated, each of the signal-comparison circuits 338-1, 338-N of the apparatus 330 may be calibrated simultaneously and/or in series. The test point circuit 332-1 has a local signal-comparison circuit 338-1 that compares $V_{ref}$ from the central DAC 344 with the $V_{test}$ from the circuit node 334-1. The test point circuit 332-1 further includes matrix circuitry 336 having a plurality of switches to selectively couple $V_{ref}$ and $V_{test}$ to one of the two differential input ports 333, 335 of the signal-comparison circuit 338-1. To calibrate the signal-comparison circuit 338-1, $V_{test}$ remains constant between the two polarities of the signal-comparison circuit 338-1. As previously described, the two polarities include a first polarity in which $V_{test}$ is coupled to the first differential input port 333 and a second polarity in which $V_{test}$ is coupled to the second differential input port 335. In FIG. 3, $V_{os}$ illustrates a symbolization of the unwanted input offset voltage, which may cause the signal-comparison circuit 338-1 to switch its output at $V_{ref,1}=V_{test}+V_{os}$ or at $V_{ref,2}=V_{test}-V_{os}$, with $V_{ref,1}$ representing $V_{ref}$ when $V_{test}$ is coupled to the first differential input port 333 (e.g., non-inverting port) for the first polarity and as associated with the first output signal, and $V_{ref,2}$ representing $V_{ref}$ when $V_{test}$ is coupled to the second input port 335 and as associated with the second output signal. The matrix circuitry 336 switches which of the input signals is coupled to which of the input ports 333, 335 to provide the first and second polarity. For the first polarity, the input offset voltage is added to the $V_{test}$. For the second polarity, the input offset voltage is added to $V_{ref}$.

$V_{ref,1}$ and $V_{ref,2}$ are used to calibrate the signal-comparison circuit 338-1. Measuring $V_{ref,1}$ and $V_{ref,2}$ by comparing to a constant value of $V_{test}$ allows for the canceling the input offset voltage and signal delay, and in specific embodiments, in addition, the effect of cross-talk using a single adjustment.

As described above, the DAC input code is distributed to all local test point circuits 332-1, 332-N. This may require an additional digital bus structure, and long signal lines changing their value at the same time, hence it may disturb the analog module under test. Embodiments in accordance with the present disclosure may reduce this disturbance by using a Gray code instead of a binary code. Because DAC input words change by one least significant bit (LSB) from one word to the next, this results in Gray code words where only one bit changes from one word to the next.

In accordance with various embodiments, the apparatus 330 further includes sine-wave generator circuitry 342 which generates a sine wave signal 339 as input to the DAC 344 and a binary-to-Gray code circuit 346. The sine-wave generator circuitry 342 provides a control signal 341 to the signal-comparison circuits 338-1, 338-N in response to the sine wave signal (e.g., the sine wave reference signal) completing a cycle. The binary-to-Gray code circuit 346 converts the DAC input codes (e.g., the sine wave signal 339) to Gray codes and which are stored on a register 340-1. For example, the registers 340-1, 340-N store the DAC input code present at the time the output signal from the signal-comparison circuits 338-1, 338-N has a rising edge. In such embodiments, the calibration circuitry (e.g., the registers 340-1, 340-N and JTAG TAP controller 348) further calibrate or set the adjustment for the at least one signal path in order to account for the input offset voltage, the signal delay, and crosstalk voltage of the clock signal 337 and the Gray codes during normal operation of the circuit (e.g., the signal-comparison circuits 338-1, 338-N).

In some specific embodiments, the DAC 344 has a resolution in a range of not less than four and not more than ten bits. In more specific embodiments, the DAC 344 has a resolution in a range of not less than six and not more than eight bits. The apparatus 330, in such embodiments, has a low pass filter arranged with the DAC 344 that generates the monotonously rising and/or falling sine wave reference signal. As the low pass filter is after the DAC 344, there may be a delay caused by the low pass filter. The calibration circuitry accounts for the input offset voltage and the signal delay attributable to the circuit (e.g., signal-comparison circuit 338-1), and a signal delay attributable to the low pass filter, using the calibrated or set adjustment during normal operation of the circuit.

Figure 4:
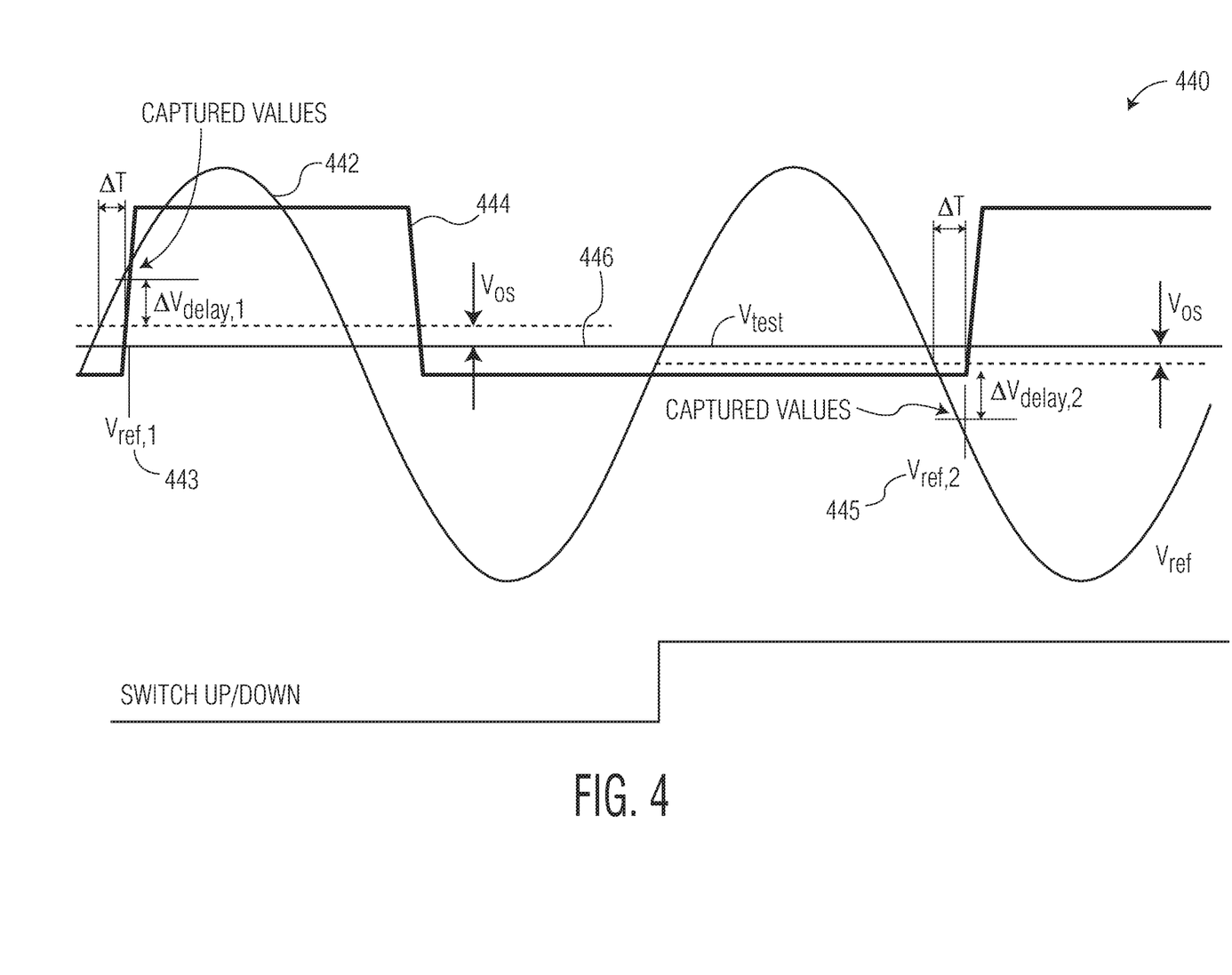
FIG. 4 is a graphical illustration of example signals of an apparatus of the type implemented in a manner consistent with FIG. 3, in accordance with the present disclosure.

FIG. 4 is a graphical illustration of example signals of an apparatus of the type implemented in a manner consistent with FIG. 3, in accordance with the present disclosure. As shown by the graphical illustration 440, the output signals indicative of measurements $V_{ref,1}$ and $V_{ref,2}$ are illustrated respectively by 443 and 445, with $V_{ref}$ 442 being illustrated in reference to $V_{test}$ 446 and the respective output signal 444 in response to comparing $V_{ref}$ 442 to $V_{test}$ 446 at the different polarities. As may be appreciated, $V_{ref,1}$ 443 is associated with the first polarity with $V_{test}$ 446 being coupled to the first input port and which provides the first output signal. $V_{ref,2}$ 445 is associated with the second polarity with $V_{test}$ 446 being coupled to the second input port and which provides the second output signal.

Also illustrated is the signal delay $\Delta V_{delay,1}$ and $\Delta V_{delay,2}$ associated with each measurement 443, 445 and the input offset voltage $V_{os}$. For the first polarity associated with $V_{ref,1}$ 443, the signal-comparison circuit changes its output in response to $V_{ref}=V_{test}+V_{os}$. Due to its internal delay, this change occurs a time $\Delta T$ later, causing a measurement error of $\Delta V_{delay,1}$. The value for $V_{ref,1}$ 443, at which the signal-comparison circuit output has its rising edge is hence $V_{ref,1}=V_{test}+V_{os}+\Delta V_{delay,1}$. For the second polarity associated with $V_{ref,2}$ 445, signal delay of the signal-comparison circuit leads to a measurement error of $\Delta V_{delay,2}$. The value for $V_{ref,2}$ 445, at which the output of the signal-comparison circuit has its rising edge is hence $V_{ref,2}=V_{test}-V_{os}+\Delta V_{delay,2}$. Because $\Delta V_{delay,1} \approx \Delta V_{delay,2}$, the average of both measurements, $\overline{V_{ref}}=(V_{ref,1}+V_{ref,2})/2$, is $\overline{V_{ref}}=(V_{ref,1}+V_{ref,2})/2 \approx V_{test}$.

With two measurements, differing in the switch setting, the input offset voltage is (completely) cancelled, and influence of the signal-comparison circuit delay is (nearly completely) cancelled. The following illustrates an example of calculating the adjustment. In the example, values are given for a $V_{test}$=0.8V, and the calculated values $V_{ref,1}$=0.9973V and $V_{ref,2}$=0.6021V, leading to $\overline{V_{ref}}$=0.7997V. $\overline{V_{ref}}$ is deviating from $V_{test}$ by as little as 0.04% or 0.65 LSB, referring to a 12-Bit DAC. Performing this simulation over the whole range of $V_{test}$=0V ... 1V shows that the maximum error $\overline{V_{ref}}$ versus $V_{test}$ is still below 1 LSB, referring to 12 bits DAC resolution. A very good accuracy at high frequencies may be achieved with moderate bandwidth of the DAC, the $V_{ref}$ bus, the switches and the signal-comparison circuit.

FIG. 5 illustrates an example apparatus for calibrating input offset voltage and signal delay, in accordance with the present disclosure. The apparatus 550, similar to the apparatus 330 of FIG. 3, may be an ATB apparatus having a plurality of local test point circuits 552-1, 552-N. Each of the local test point circuits 552-1, 552-N has a circuit node 554-1, 554-N which is tested by a respective signal-comparison circuit 558-1, 558-N using input signals from the circuit node 554-1, 554-N and a central DAC 564. An analog bus distributes $V_{ref}$ from the DAC 564 to the signal-comparison circuits 558-1, 558-N of each of the plurality of local test point circuits 552-1, 552-2. The apparatus 550 further includes calibration circuitry, which may include portions local to the test point circuits 552-1, 552-N (e.g., registers 560-1, 560-N) and central to the apparatus 550 (e.g., JTAG controller 568) used to calibrate the signal-comparison circuits 558-1, 558-N.

As previously described, the signal-comparison circuits 558-1, 558-N may be calibrated. High-precision measurements are often disturbed by the cross-talk of signals which are distributed over a large area of the IC or the analog module. One example is the clock signal 557, another is the Gray-coded DAC input signal 573 which is distributed to all local test point circuits 552-1, 552-2. While in many ICs, all or nearly all other signals may be switched off during measurement of analog nodes, the clock signal 557 and the Gray-coded DAC input signals 573 are used for this measurement.

In a number of embodiments, in addition to the input offset voltage and signal delay, the crosstalk voltage of both the clock signal 557 and the Gray-coded DAC input voltage (e.g., Gray-coded DAC input signal 573) are cancelled. Similarly to the previously described apparatuses, each of the signal-comparison circuits 558-1, 558-N of the apparatus 550 are calibrated by measurement runs in which the input signals to the signal-comparison circuits 558-1, 558-N are selectively switch between the $V_{ref}$ and the respective $V_{test}$ of the corresponding circuit node 554-1, 554-N. The following describes calibration of the particular signal-comparison circuit 558-1 of the test point circuit 552-1, but as may be appreciated, each of the signal-comparison circuits of the apparatus 550 may be calibrated simultaneously and/or in series. The local test point circuit 552-1 has a local signal-comparison circuit 558-1 that compares $V_{ref}$ from the central DAC 564 with the $V_{test}$ from the circuit node 554-1. The matrix circuit 556, which has a plurality of switches, selectively couples $V_{ref}$ and $V_{test}$ to one of the two differential input ports of the signal-comparison circuit 558-1. To calibrate the signal-comparison circuit 558-1, $V_{test}$ remains constant between two polarities of the signal-comparison circuit 558-1. As previously described, the two polarities include a first polarity in which $V_{test}$ is coupled to the first differential input port and a second polarity in which $V_{test}$ is coupled to the second differential input port. The matrix circuit 556 switches which of the input signals is coupled to which of the input ports to provide the first and second polarity. For the first polarity, the input offset voltage is added to the $V_{test}$. For the second polarity, the input offset voltage is added to $V_{ref}$.

The apparatus 550 further includes sine-wave generator circuitry 562 which generates a sine wave signal 559 as input to the DAC 564 and a binary-to-Gray code circuit 566 that converts the DAC input codes (e.g., the signals that are to be converted in the DAC 564 into the sine wave signal 559) to Gray codes 573 that are input to the registers 560-1, 560-N. The sine-wave generator circuitry 562 further provides a (switching) control signal 561 to the signal-comparison circuits 558-1, 558-N in response to the sine wave signal (e.g., the sine wave reference signal 559) completing a cycle. Between the two polarities associated with the first and second output signals, the sine-wave generator circuitry 562 is clocked in the first measurement associated with the first output signal with the rising clock edge, and in the second measurement associated with the second output signal with the falling clock edge. Hence the DAC input code (e.g., the sine wave signal 559) changes either at the rising, or the falling clock edge of the clock signal 557. Additionally, in various embodiments, the signal-comparison circuits 558-1, 558-N are clocked in the first measurement when the bit in the Gray code 573 is changing from 0 to 1, and the second measurement, when the bit is changing from 1 to 0. For example, with:

$\Delta V_{fall}$: The crosstalk voltage (referred to the inputs of the signal-comparison circuit) in case of a falling clock edge, and a Gray code bit changing from 1 to 0; and $\Delta V_{rise}$: The crosstalk voltage (referred to the inputs of the signal-comparison circuit) in case of a rising clock edge, and a Gray code bit changing from 0 to 1.

Then due to the linear transfer function of the cross-talk, $\Delta V_{fall} \approx \Delta V_{rise}$. Hence:

$$V_{ref,1} = V_{test} + V_{os} + \Delta V_{delay,1} + \Delta V_{fall}$$

$$V_{ref,2} = V_{test} - V_{os} + \Delta V_{delay,2} - \Delta V_{fall}, \text{ and}$$

$$\overline{V_{ref}} = (V_{ref,1} + V_{ref,2})/2 \approx V_{test}.$$

The apparatus 550 illustrated by FIG. 5 captures the different clock edges clocking the sine-wave generator circuitry 562 and the signal-comparison circuits 558-1, 558-N. The binary-to-Gray code circuit 566 provides a "Gray Code up/down" bit, indicating if the one Gray code bit that changed in the current code transition, is a 0→1 change or a 1→0 change. This "Gray Code up/down" bit is used to gate the clock to the signal-comparison circuits 558-1, 558-N, to ensure that they are only clocked in case of a 0→1 change (first measurement), and a 1→0 change (second measurement).

Figure 6:
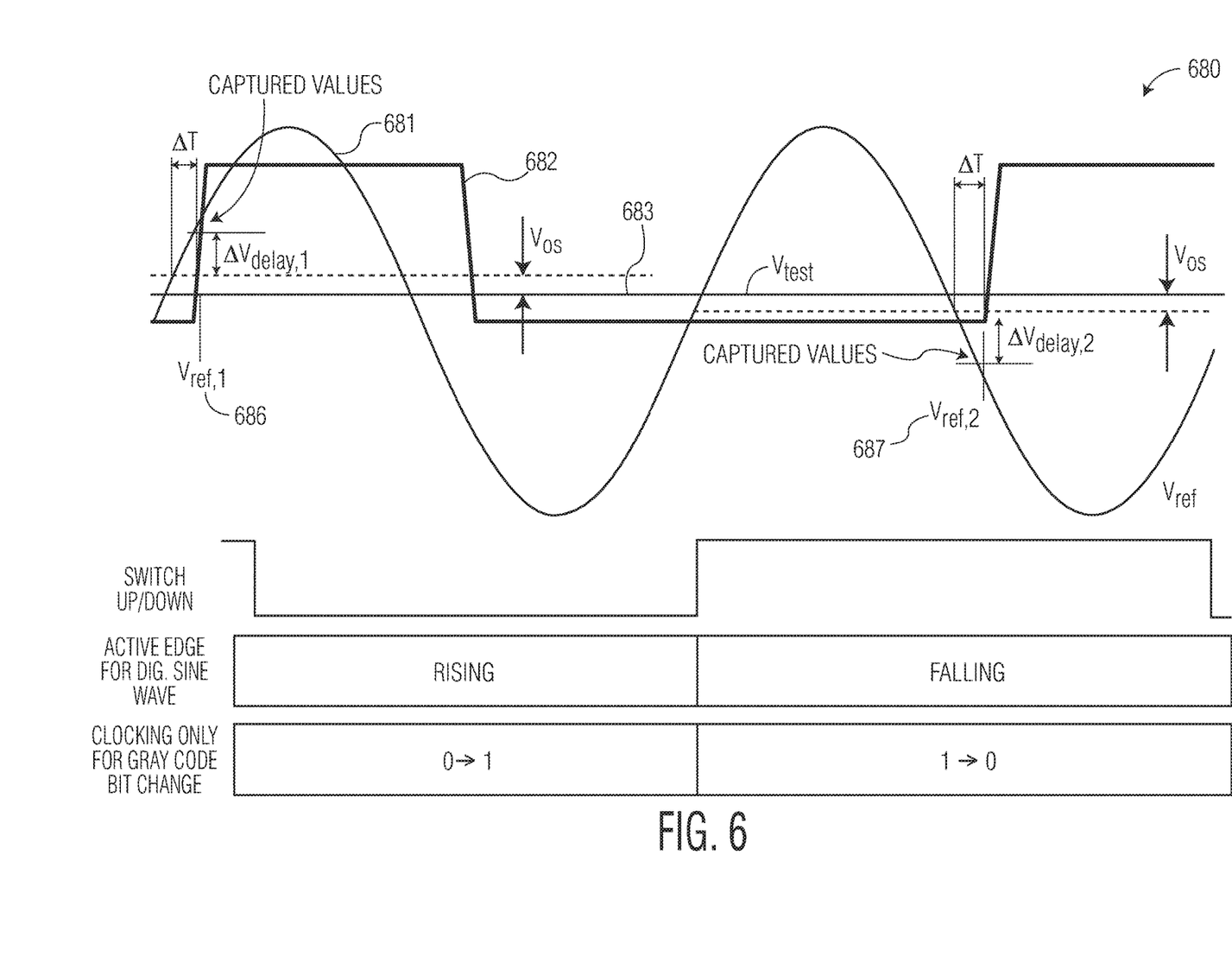
FIG. 6 is a graphical illustration of example signals of an apparatus of the type implemented in a manner consistent with FIG. 5, in accordance with the present disclosure.

FIG. 6 is a graphical illustration of example signals of an apparatus of the type implemented in a manner consistent with FIG. 5, in accordance with the present disclosure. As shown by the graphical illustration 680, the output signals indicative of measurements $V_{ref,1}$ and $V_{ref,2}$ are illustrated respective as 686 and 687, with $V_{ref}$ 681 being illustrated in reference to $V_{test}$ 683 and the respective output signal 682 in response to comparing $V_{ref}$ 681 to $V_{test}$ 683 at the different polarities. As may be appreciated, $V_{ref,1}$ 686 is associated with the first polarity with $V_{test}$ 683 being coupled to the first input port and which provides the first output signal. $V_{ref,2}$ 687 is associated with the second polarity with $V_{test}$ 683 being coupled to the second input port and which provides the second output signal.

Also illustrated is the signal delay $\Delta V_{delay,1}$ and $\Delta V_{delay,2}$ associated with each measurement and the input offset voltage $V_{os}$. For the first polarity associated with $V_{ref,1}$ 686, the signal-comparison circuit changes its output as soon as $V_{ref}=V_{test}+V_{os}$. Due to its internal delay, this change occurs a time $\Delta T$ later, causing a measurement error of $\Delta V_{delay,1}$. For the second polarity associated with $V_{ref,2}$ 687, signal delay of the signal-comparison circuit leads to a measurement error of $\Delta V_{delay,2}$. Additionally illustrated are the signals for the switches in the matrix circuitry, the rising/falling edge signal for $V_{ref}$ and clocking for gray code bit change.

Figure 7:
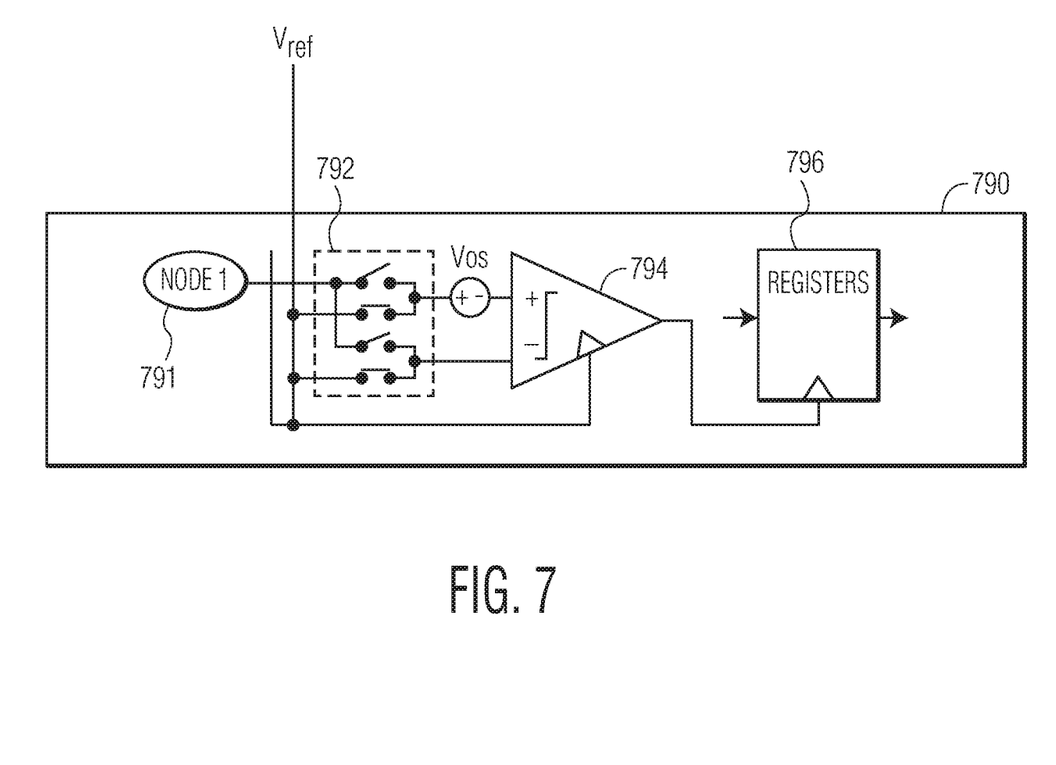
FIG. 7 is an example apparatus for creating a physically unclonable function (PUF), in accordance with the present disclosure.

FIG. 7 is an example apparatus for creating a PUF, in accordance with the present disclosure. Various embodiments, such as the various apparatuses previously described, are used to provide a PUF, and thus may be considered a PUF circuit. A PUF circuit delivers a binary pattern that varies from IC to IC of the same type, and is stable with each IC. The PUF may serve as a unique identifier and/or for cryptographic purposes to create an encryption key. In many instances, PUFs are created using a static random access memory (SRAM). When powered up, the SRAM cell randomly settles in one of the two stable states. Because a conventional SRAM is normally symmetrical, the state it is in when powered-up is unpredictable. In many ICs, however SRAMs are not implemented, or not usable for PUF for other reasons.

Embodiments in accordance with the present disclosure utilize the signal-comparison circuits to create a PUF. As signal-comparison circuits (e.g., amplifiers and/or comparators) are generally built up symmetrically, the offset voltage may have a positive or a negative sign. If both input signals have the same voltage, the output signal may be 0 or 1, each with an approximately fifty percent likelihood.

Any of the above described apparatus may be used to generate a PUF. FIG. 7 illustrates a single test point circuit 790, however, and as may be appreciated, a plurality of test point circuits may be used with the PUF being generated from output signals from the plurality of signal-comparison circuits. As previously described, in specific embodiments, the test point circuit 790 includes a signal-comparison circuit 794 having complementary input ports to receive input signals include $V_{ref}$ from a DAC and a $V_{test}$ from the circuit node 791 and uses the input signals to test at least one DC voltage associated with the circuit 794. The test point circuit 790 further includes matrix circuitry 792 used to provide the first and second polarity of the signal-comparison circuit 794 by selectively coupling the input ports to ones of the input signals. To create a PUF, the matrix circuitry 792 couples both of the differential input ports of the signal-comparison circuit 794 to $V_{ref}$, such as at start-up or other times, and the $V_{ref}$ is used to create a PUF due to a sensed input offset voltage being negative or positive with an approximately fifty percent likelihood, which are stored using the registers 796 as previously described. Creating a PUF, in specific embodiments, may be independent of $V_{test}$ and/or $V_{test}$ may otherwise not be used in creating the PUF. For example, the switches are set such that both input ports are connected to the $V_{ref}$ bus.

Using the signal-comparison circuits to create the PUF may be beneficial as aging and/or environmental influences, such as temperature or variations of the supply voltage, may not impact the PUF over time or may be corrected for. Robustness against such environmental changes usually depends on a number of other parameters. While in SRAM, there is little possibility to find the optimal parameter, in the case of signal-comparison circuits are used to create a PUF, the DAC voltage is chosen freely, in order to find the point where PUF creation is most robust. Robustness is also reduced by aging. This effect is often so marked that dedicated anti-aging mechanisms need to be implemented. Aging for analog circuits, as signal-comparison circuits, is usually better understood and better controllable than for digital circuits. As such, there is a good likelihood that the signal-comparison-based solution may be made more robust against aging, than an SRAM-based solution.

Terms to exemplify orientation, such as upper/lower, left/right, top/bottom and above/below, may be used herein to refer to relative positions of elements as shown in the figures. It should be understood that the terminology is used for notational convenience only and that in actual use the disclosed structures may be oriented different from the orientation shown in the figures. Thus, the terms should not be construed in a limiting manner.

The skilled artisan would recognize that various terminology as used in the Specification (including claims) connote a plain meaning in the art unless otherwise indicated. As examples, the Specification describes and/or illustrates aspects useful for implementing the claimed disclosure by way of various circuits or circuitry which may be illustrated as or using terms such as blocks, modules, device, system, unit, controller, and/or other circuit-type depictions (e.g., reference numerals 106 and 218 of FIGS. 1 and 2 depict a block/module as described herein). Such circuits or circuitry are used together with other elements to exemplify how certain embodiments may be carried out in the form or structures, steps, functions, operations, activities, etc. For example, in certain of the above-discussed embodiments, one or more modules are discrete logic circuits or programmable logic circuits configured and arranged for implementing these operations/activities, as may be carried out in the approaches described herein. In certain embodiments, such a programmable circuit is one or more computer circuits, including memory circuitry for storing and accessing a program to be executed as a set (or sets) of instructions (and/or to be used as configuration data to define how the programmable circuit is to perform), and an algorithm or process as described herein used by the programmable circuit to perform the related steps, functions, operations, activities, etc. Depending on the application, the instructions (and/or configuration data) may be configured for implementation in logic circuitry, with the instructions (whether characterized in the form of object code, firmware or software) stored in and accessible from a memory (circuit).

Based upon the above discussion and illustrations, those skilled in the art will readily recognize that various modifications and changes may be made to the various embodiments without strictly following the exemplary embodiments and applications illustrated and described herein. For example, methods as exemplified in the Figures may involve steps carried out in various orders, with one or more aspects of the embodiments herein retained, or may involve fewer or more steps. For example, the apparatus illustrated by FIG. 1 may be implemented as the apparatus illustrated by FIG. 3 and/or FIG. 5. As another example, the PUF generated by the apparatuses illustrated by FIG. 1, 3, or 5, such as described by FIG. 7. Such modifications do not depart from the true spirit and scope of various aspects of the disclosure, including aspects set forth in the claims.

What is claimed is:

1. An apparatus comprising:
a circuit having complementary input ports to receive input signals including a wave reference signal and a voltage-test signal to test at least one direct current (DC) voltage associated with the circuit by comparing the input signals using
a first polarity associated with the circuit to produce a first output signal, and
a second polarity associated with the circuit to produce a second output signal, wherein during operation, the circuit manifests an input voltage offset and a signal delay with each comparison of the input signals;
calibration circuitry to process the first and second output signals and, in response, calibrate or set an adjustment for at least one signal path associated with the circuit in order to account for the input offset voltage and signal delay during normal operation of the circuit; and
a logic circuit to couple the complementary input ports to the wave reference signal and in response, to create a unique signal which is stable over a plurality of power cycles due to a sensed offset voltage being negative or positive with an approximately fifty-percent likelihood.

2. The apparatus of claim 1, wherein the circuit includes matrix circuitry configured and arranged to couple the voltage-test signal to a first of the complementary input ports for the first polarity of the circuit and couple the voltage-test signal to a second of the complementary input ports for the second polarity of the circuit, and the voltage-test signal being a constant value for the first and second output signals.

3. The apparatus of claim 1, further including a digital-to-analog converter (DAC) configured to generate the wave reference signal and configured and arranged with the circuit to selectively drive a different one of the complementary input ports of the circuit to produce the first and second output signals.

4. The apparatus of claim 3, wherein the apparatus is an analog-test bus (ATB) apparatus, further includes a digital bus configured and arranged to distribute DAC input codes to a plurality of local test points of the apparatus.

5. The apparatus of claim 3, further including a binary-to-Gray code circuit configured to convert DAC input codes to Gray codes, wherein the complementary input ports are differential input ports, and wherein the wave reference signal is characterized by a sinusoid or a curve that describes a continuous oscillation.

6. An apparatus comprising:
a circuit having complementary input ports to receive input signals including a wave reference signal and a voltage-test signal to test at least one direct current (DC) voltage associated with the circuit by comparing the input signals using
a first polarity associated with the circuit to produce a first output signal, and
a second polarity associated with the circuit to produce a second output signal, wherein during operation, the circuit manifests an input voltage offset and a signal delay with each comparison of the input signals; and
calibration circuitry to process the first and second output signals and, in response, calibrate or set an adjustment for at least one signal path associated with the circuit in order to account for the input offset voltage and signal delay during normal operation of the circuit, wherein the circuit and calibration circuitry are configured to, responsive to the first and second output signals, calibrate or set the adjustment for the at least one signal path associated with the circuit in order to account for the input offset voltage, the signal delay, and crosstalk voltage of a clock signal during normal operation of the circuit.

7. The apparatus of claim 1, wherein the circuit includes matrix circuitry having a plurality of switch circuits configured and arranged to selectively provide the wave reference signal and the voltage-test signal to the complementary input ports of the circuit to provide each of the first and second output signals.

8. The apparatus of claim 1, wherein the circuit includes matrix circuitry configured and arranged to selectively provide the wave reference signal to a first of the complementary input ports and the voltage-test signal to a second of the complementary input ports for one of the first and second output signals and selectively provide the wave reference signal to the second of the complementary input ports and the voltage-test signal to the first of the complementary input ports for the other of the first and second output signals.

9. The apparatus of claim 1, wherein the circuit includes matrix circuitry configured to selectively couple the complementary input ports of the circuit to the wave reference signal and the voltage-test signal in response to the wave reference signal being equal to or greater than the voltage-test signal plus the input offset voltage.

10. The apparatus of claim 1, wherein the circuit includes matrix circuitry configured to selectively couple the complementary input ports of the circuit to the wave reference signal and the voltage-test signal in response to the wave reference signal being equal to or less than the voltage-test signal minus the input offset voltage.

11. The circuit of claim 1, further including a test point circuit that includes a memory circuit to store codes corresponding to the first and second output signals of the circuit.

12. The circuit of claim 11, further including a plurality of test point circuits, including the test point circuit, each of the plurality of test point circuits including a respective memory circuit.

13. The circuit of claim 1, further including sine-wave generator circuitry configured to provide a control signal to the circuit in response to the wave reference signal completing a cycle, wherein the wave reference signal is a sine wave.

14. The apparatus of claim 1, wherein the complementary input ports are differential input ports, and the logic circuit includes matrix circuitry to couple the differential input ports of the circuit to the wave reference signal, and the wave reference signal is used to create a Physically Unclonable Function (PUF) due to the sensed offset voltage being negative or positive with an approximately fifty percent likelihood.

15. An apparatus comprising:
a digital-to-analog converter (DAC) configured to generate a wave reference signal, wherein the DAC has a resolution in a range of not less than four and not more than ten bits;
a circuit having complementary input ports to receive input signals including a wave reference signal and a voltage-test signal to test at least one direct current (DC) voltage associated with the circuit by comparing the input signals using
a first polarity associated with the circuit to produce a first output signal in response to one of the complementary input ports coupled to the voltage-test signal, and
a second polarity associated with the circuit to produce a second output signal in response to the other of the complementary input ports coupled to the voltage-test signal, wherein during operation, the circuit manifests an input voltage offset and a signal delay with each comparison of the input signals; and calibration circuitry to process the first and second output signals and, in response, calibrate or set an adjustment for at least one signal path associated with the circuit in order to account for the input offset voltage and signal delay during normal operation of the circuit.

16. The apparatus of claim 15, wherein the DAC is configured and arranged with the circuit to selectively drive the other of the complementary input ports of the circuit for the first polarity and the one of the complementary input ports for the second polarity, the apparatus further including:

a circuit node configured and arranged with the circuit to selectively drive the one of the complementary input ports of the circuit with the voltage-test signal for the first polarity and the other of the complementary input ports of the circuit with the voltage-test signal for the second polarity.

17. The apparatus of claim 15, wherein the apparatus further includes:

a low pass filter configured and arranged with the DAC to generate the wave reference signal, wherein the calibration circuitry is configured and arranged with the circuit to account for the input offset voltage and the signal delay attributable to the circuit, and a signal delay attributable to the low pass filter, using the calibrated or set adjustment during normal operation of the circuit.

18. The apparatus of claim 15, further including a plurality of circuits, the plurality including the circuit, each respectively including a circuit node configured and arranged to generate a respective voltage-test signal, wherein the calibration circuitry is configured and arranged with the plurality of circuits to process respective first and second output signals and, in response, calibrate or set a plurality of adjustments for a plurality of signal paths associated with the plurality of circuits in order to account for the input offset voltage and signal delay during normal operation of the plurality of circuits.

19. The apparatus of claim 18, wherein each of the plurality of circuits include matrix circuitry configured to couple the complementary input ports of each of the plurality of circuits to the wave reference signal and, in response, to produce a plurality of additional output signals, and the calibration circuitry is configured and arranged with the plurality of circuits to provide a physically unclonable function (PUF) circuit using the plurality of additional output signals.

20. An apparatus comprising:

a digital-to-analog converter (DAC) configured to generate a falling wave reference signal, wherein the DAC has a resolution in a range that has not more than ten bits;

a circuit having differential-input ports to receive input signals including a wave reference signal and a voltage-test signal to test at least one direct current (DC) voltage associated with the circuit by comparing the input signals using a first polarity associated with the circuit to produce a first output signal in response to one of the differential-input ports coupled to the voltage-test signal, and a second polarity associated with the circuit to produce a second output signal in response to the other of the differential-input ports coupled to the voltage-test signal, wherein during operation, the circuit manifests an input voltage offset and a signal delay with each comparison of the input signals;

a binary-to-Gray code circuit to convert DAC input codes to Gray codes; and calibration circuitry to process the first and second output signals and, in response, calibrate or set an adjustment for at least one signal path associated with the circuit to account for the input offset voltage, signal delay during normal operation of the circuit, and crosstalk voltage of a clock signal and the Gray codes during normal operation of the circuit.

* * * * *